(12) United States Patent
Yamamoto

(10) Patent No.: US 8,030,115 B2
(45) Date of Patent: Oct. 4, 2011

(54) SOLID-STATE IMAGE PICKUP DEVICE WITH COLOR FILTER AND METHOD OF MANUFACTURING THE SAME

(75) Inventor: Katsumi Yamamoto, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 14 days.

(21) Appl. No.: 12/454,000

(22) Filed: May 28, 2009

(65) Prior Publication Data

US 2009/0230492 A1 Sep. 17, 2009

Related U.S. Application Data

(63) Continuation of application No. PCT/JP2007/072643, filed on Nov. 22, 2007.

(30) Foreign Application Priority Data

Nov. 28, 2006 (JP) .................................. 2006-320370

(51) Int. Cl.
*H01L 31/18* (2006.01)
(52) U.S. Cl. ................ 438/70; 438/75; 438/69; 438/60; 438/72
(58) Field of Classification Search .................... 438/60, 438/70, 75, 16, 57, 69, 71
See application file for complete search history.

(56) References Cited

U.S. PATENT DOCUMENTS

| | | | | |
|---|---|---|---|---|
| 6,255,640 B1 * | 7/2001 | Endo et al. | ................. | 250/208.1 |
| 2005/0236553 A1 * | 10/2005 | Noto et al. | ................. | 250/208.1 |
| 2009/0115011 A1 * | 5/2009 | Ushiro et al. | ................. | 257/432 |

FOREIGN PATENT DOCUMENTS

| | | |
|---|---|---|
| JP | 4-42966 | 2/1992 |
| JP | 5-55536 | 3/1993 |
| JP | 9-27608 | 1/1997 |
| JP | 9-45885 | 2/1997 |
| JP | 09-045885 | * 2/1997 |
| JP | 11-284158 | 10/1999 |
| JP | 2000-66016 | 3/2000 |
| JP | 2002-110953 | 4/2002 |
| JP | 2006-41467 | 2/2006 |
| KR | 10-2006-0097343 | 9/2006 |

OTHER PUBLICATIONS

Machine translation of JP09-045885 has been attached.*
International Search Report for International Application PCT/JP2007/072643, mailed Feb. 12, 2008.
Korean Office Action issued Nov. 29, 2010 in corresponding Korean Patent Application 10-2009-7010833.
Chinese Office Action issued Mar. 9, 2010 in corresponding Chinese Patent Application 200780044124.8.
English Translation of the International Preliminary Report on Patentability issued Aug. 26, 2010 in corresponding International Patent Application PCT/JP2007/072643.

* cited by examiner

*Primary Examiner* — Wai Sing Louie
*Assistant Examiner* — Bilkis Jahan

(57) ABSTRACT

A solid-state image pickup device which includes a substrate carrying a plurality of photoelectric conversion elements which are two-dimensionally arranged therein the substrate having a plurality of rectangular light-receiving faces each corresponding to the photoelectric conversion element, a flattening layer having a plurality of approximately rectangular concave faces each located to correspond to the light-receiving faces, and a color filter having color layers of plural kinds of colors and buried in the concave faces of the flattening layer, the color filter exhibiting a larger refractive index than that of the flattening layer, wherein the color layers are respectively enabled to function as a convex lens.

4 Claims, 3 Drawing Sheets

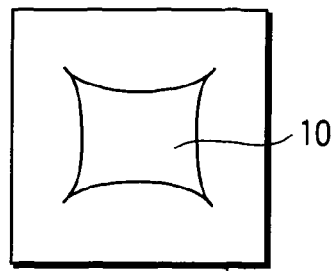
F I G. 3A  Assumed light-receiving face
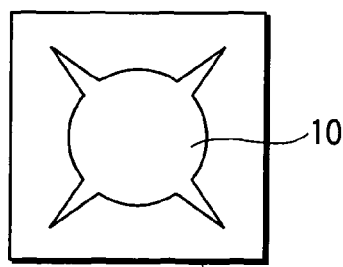
F I G. 3B  Assumed light-receiving face
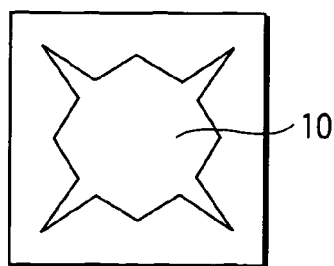
F I G. 3C  Assumed light-receiving face

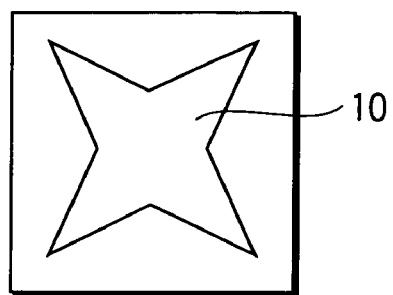
F I G. 3D  Assumed light-receiving face
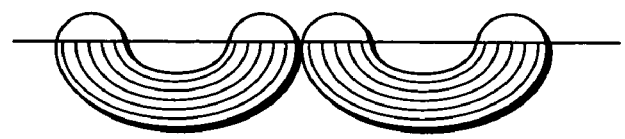
F I G. 4
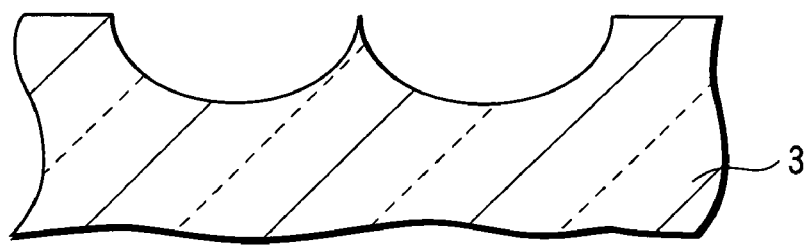
F I G. 5

… (1)

SOLID-STATE IMAGE PICKUP DEVICE WITH COLOR FILTER AND METHOD OF MANUFACTURING THE SAME

CROSS-REFERENCE TO RELATED APPLICATIONS

This is a Continuation Application of PCT Application No. PCT/JP2007/072643, filed Nov. 22, 2007, which was published under PCT Article 21(2) in Japanese.

This application is based upon and claims the benefit of priority from prior Japanese Patent Application No. 2006-320370, filed Nov. 28, 2006, the entire contents of which are incorporated herein by reference.

BACKGROUND OF THE INVENTION

1. Field of the Invention

This invention relates to a solid-state image pickup device and to a method for manufacturing the same. In particular, this invention relates to a solid-state image pickup device wherein a color filter is utilized also as a lens member and to a method of manufacturing the same.

2. Description of the Related Art

In recent years, digital cameras and video cameras utilizing a solid-state image pickup element such as a charge coupled device (CCD) and complementary metal oxide semiconductor (C-MOS) device have been increasingly popularized and, at the same time, the techniques to further miniaturize the solid-state image pickup element by making use of a chip-size package (CSP) system have been developed. The solid-state image pickup element of such a small size is suitable for building into electronic equipment such as mobile telephones where miniaturization, lightness and slimness are desired.

Since the light-receiving face of each of the pixels of solid-state image pickup element is constituted by a rugged surface, it is generally practiced to deposit a transparent flattening layer on the surface of the solid-state image pickup element, thereby flattening the surface of the solid-state image pickup element. More specifically, as shown in FIG. 1, a first flattening layer 13 is deposited at first on the surface of a solid-state image pickup element 11 in which a plurality of photoelectric conversion elements 12 such as CCD are two-dimensionally arranged. Then, a color filter 14 comprising color layers of plural kinds of colors is formed on the first flattening layer 13 and a second flattening layer 15 is formed on the surface of the color filter 14. Furthermore, convex lenses 16 for condensing light are formed on the second flattening layer 14 (see for example, JP-A 2006-41467).

In the manufacture of the solid-state image pickup element constructed in this manner, the first flattening layer 13, color filter 14, second flattening layer 15 and convex lenses 16 are required to be successively formed, raising many problems such as the requirement of a large number of steps, deterioration of yield and increase of manufacturing costs.

There is another problem that since a large number of intervening layers such as the first flattening layer 13, color filter 14 and second flattening layer 15 are interposed between the light-receiving face and convex lens 16 and hence the light-receiving face is fairly spaced away from the convex lens 16, the light-collecting efficiency is degraded and attenuation of light is more likely to occur in the path by which the light reaches the photoelectric conversion element 12.

BRIEF SUMMARY OF THE INVENTION

It is an object of the present invention to provide a solid-state image pickup device which is excellent in sensitivity and is capable of achieving excellent color characteristics.

It is another object of the present invention to provide a method of manufacturing a solid-state image pickup device, which makes it possible to reduce the number of manufacturing steps, to enhance the yield and to reduce the manufacturing costs.

According to a first aspect of the present invention, there is provided a solid-state image pickup device which comprises: a substrate including a plurality of photoelectric conversion elements which are two-dimensionally arranged therein the substrate having a plurality of rectangular light-receiving faces each corresponding to the photoelectric conversion element; a flattening layer having a plurality of approximately rectangular concave faces each located to correspond to the light-receiving faces; and a color filter including color layers of plural kinds of colors and buried in the concave faces of the flattening layer, the color filter exhibiting a larger refractive index than that of the flattening layer; wherein the color layers are respectively enabled to function as a convex lens.

According to a second aspect of the present invention, there is provided a method of manufacturing a solid-state image pickup device, the method comprising: forming a transparent film on a surface of a substrate including a plurality of photoelectric conversion elements which are two-dimensionally arranged therein, the substrate having a plurality of rectangular light-receiving faces each corresponding to the photoelectric conversion element; forming a resist pattern having bobbin-shaped or deformed bobbin-shaped openings each being located in conformity with each of the light-receiving faces; etching the transparent film with the resist pattern being employed as a mask to form a flattening layer having a plurality of approximately rectangular concave faces each located to correspond to the light-receiving faces; forming a color filter including color layers of plural kinds of colors in the approximately rectangular concave faces and exhibiting a larger refractive index than that of the flattening layer; wherein the color layers are respectively enabled to function as a convex lens.

BRIEF DESCRIPTION OF THE SEVERAL VIEWS OF THE DRAWING

FIG. 3A is a plan view illustrating the configuration of the opening of the resist pattern employed in the manufacture of the solid-state image pickup element shown in FIG. 2;

FIG. 3B is a plan view illustrating the configuration of the opening of the resist pattern employed in the manufacture of the solid-state image pickup element shown in FIG. 2;

FIG. 3C is a plan view illustrating the configuration of the opening of the resist pattern employed in the manufacture of the solid-state image pickup element shown in FIG. 2;

FIG. 3D is a plan view illustrating the configuration of the opening of the resist pattern employed in the manufacture of the solid-state image pickup element shown in FIG. 2;

FIG. 4 is a diagram showing curves illustrating the process of dry etching; and FIG. 5 is a cross-sectional view illustrating the planar configuration of the flattening layer that has been obtained from dry etching.

DETAILED DESCRIPTION OF THE INVENTION

There will now be described embodiments of the present invention.

Figure 1:
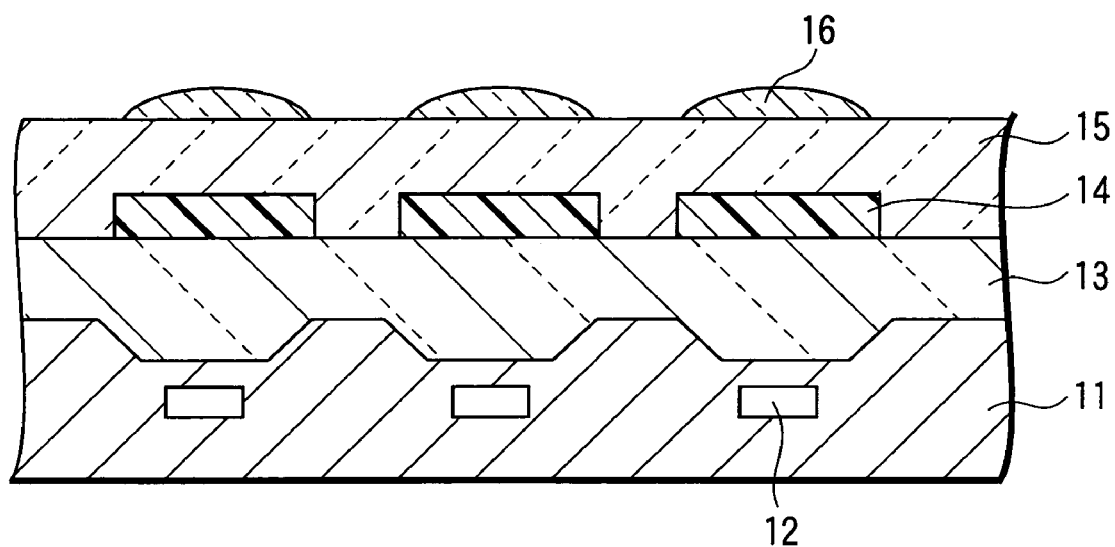
FIG. 1 is a cross-sectional view illustrating a solid-state image pickup device according to the prior art.
Figure 2:
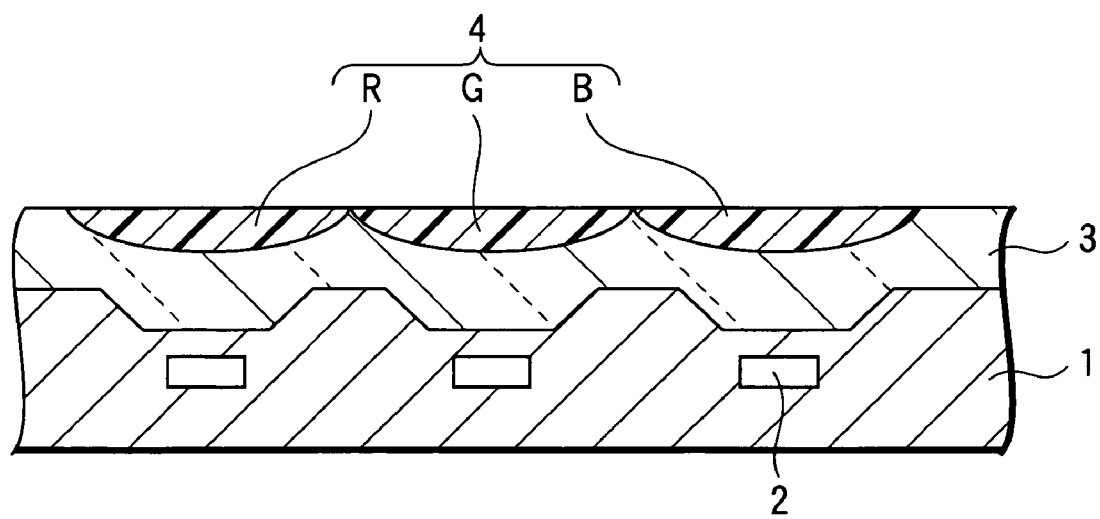
FIG. 2 is a cross-sectional view illustrating a solid-state image pickup device according to one embodiment of the present invention.

FIG. 2 is a cross-sectional view illustrating a solid-state image pickup device according to one embodiment of the present invention. Referring to FIG. 2, a plurality of photoelectric conversion elements 2 each representing a CCD, CMOS sensor, etc., are two-dimensionally arranged in the vicinity of the surface of a semiconductor substrate 1. The surface portions of the semiconductor substrate 1 which correspond to the photoelectric conversion elements 2 represent respectively a rectangular concave light-receiving face. A flattening layer 3 is formed to cover these light-receiving faces. This flattening layer 3 is formed of a transparent material such as silicon dioxide or acrylic resin for instance.

The flattening layer 3 is provided, on the surface thereof, with a plurality of approximately rectangular (in planar configuration) concave faces each located to correspond to the light-receiving faces. This flattening layer 3 having such approximately rectangular concave faces can be formed as explained below.

First of all, a film made of a transparent material is formed on the surface of the semiconductor substrate 1. When this transparent material is silicon dioxide, the film can be formed by means of CVD or vapor deposition. When this transparent material is acrylic resin, the film can be formed by way of the coating method. Then, a resist pattern is formed on this transparent film. This resist pattern is provided with bobbin-shaped or deformed bobbin-shaped openings. Various shapes of each of such openings 10 are illustrated in FIGS. 3A-3D. The rectangular region surrounding the opening 10 represents a light-receiving face. In FIG. 3A, a bobbin-shaped opening 10 is shown. In FIGS. 3B-3D, the openings 10 having various deformed configurations are shown. Specifically, the opening 10 shown in FIG. 3B has the shape in which an acute-angled horn-like space is extended in four directions from a circular opening. The opening 10 shown in FIG. 3C has the same shape as that shown in FIG. 3B except that an obtuse-angled space portion is extended from the upper and lower portions and the right and left portions of the circular opening. The opening 10 shown in FIG. 3D differs from the opening shown in FIG. 3C in that the upper and lower portions and the right and left portions of the opening are dented.

Then, by making use of this resist pattern as a mask, the transparent film formed on the surface of the semiconductor substrate 1 is subjected to dry etching. When the transparent film of silicon dioxide is to be etched, a positive novolac resin photoresist, for example, may be used as a resist and $CF_4$ or $C_2F_6$ may be used as an etching gas. Further, when the transparent film of acrylic resin is to be etched, a positive novolac resin photoresist may be used likewise as a resist and $O_2+Ar$, for example, may be used as an etching gas.

As for the dry etching, it is possible to employ, for example, ECR, parallel plate magnetron, DRM, ICP or double-frequency-type RIE.

FIG. 4 shows curves illustrating the progressing state of dry etching. It will be recognized from FIG. 4 that, at first, the film is etched in conformity with the configuration of the opening of mask, thus permitting the etching to proceed not only in the vertical direction but also in the lateral direction. Therefore, the etching is enabled to spread to a portion of the transparent film which is covered by the resist pattern. As a result, it is possible to form the flattening layer 3 wherein a plurality of approximately rectangular concave faces are directly neighboring each other as shown in FIG. 5.

Subsequently, a resin containing a pigment dispersed therein is coated on the flattening layer 3 and then subjected to patterning by means of lithography. These steps are repeated for each color, thereby creating a color filter 4 comprising three-color layers of red (R), green (G) and blue (B) colors for instance and filling the concave faces formed on the surface of flattening layer 3 with these color layers.

In this case, in view of enhancing the utilization efficiency of light, the surface of each of color layers may preferably be configured such that these color layers are directly neighboring without any flattening layer 3 being interposed therebetween. Further, the surface of the color filter 4 may preferably be flat.

As for the method to create a flat surface of the color filter 4, it is possible to employ a method wherein each of color filters 4 is formed by means of photolithography at first, and then the resultant surface is polished by means of the micropolishing method.

The refractive index of the coloring material constituting the color filter 4 may be higher than the refractive index of the material constituting the flattening layer 3. For example, in a case where the material constituting the flattening layer 3 is acrylic resin, the refractive index of the flattening layer 3 is 1.5. Whereas, the refractive index of the coloring material constituting the color filter 4 may be 1.6-1.8 if the coloring material is acrylic resin containing pigments dispersed therein.

As described above, according to this embodiment, it is possible to form the flattening layer 3 having surface features wherein a plurality of approximately rectangular concave faces are directly neighboring each other by dry etching a transparent film using a resist pattern having bobbin-shaped or deformed bobbin-shaped openings as a mask. Further, by filling these concave faces with color layers consisting of three kinds of pigment-dispersed resins (i.e., red [R], green [G] and blue [B] color layers) in a manner to make flat the surface of color layers, it is possible to obtain a solid-state image pickup element which is provided with the color filter 4 functioning also as a lens.

In the case of the solid-state image pickup device constructed in this manner, since the color filter and the lens are no longer required to be separately formed with a flattening layer being interposed therebetween, the number of manufacturing steps can be reduced and, at the same time, it is possible to enhance the yield and reduce the manufacturing costs.

Further, since the convex lens (color filter 4) is disposed close to the light-receiving face, the light-converging property can be enhanced to realize high sensitivity. Further, since the number of intervening layers can be minimized, it is possible to minimize the attenuation of incident light, thus making it possible to obtain excellent color characteristics.

According to the first aspect of the present invention, since the approximately rectangular concave faces formed on the surface of flattening layer are filled with color filter including plural kinds of color layers and functioning also as a convex lens, it is possible to dispose the convex lens (color filter) close to light-receiving face, thereby enhancing the light-converging property and achieving high sensitivity. Further, since the number of intervening layers can be minimized, it is possible to provide a solid-state image pickup device having excellent color characteristics.

According to the second aspect of the present invention, a flattening layer having surface features wherein a plurality of approximately rectangular concave faces directly neighboring each other can be formed by dry etching a transparent film using a resist pattern having bobbin-shaped or deformed bobbin-shaped openings as a mask, and then these concave faces are filled with color layers formed of pigment-dispersed resin, thereby making it possible to create color filters functioning also as a lens. Therefore, it is possible to reduce the number of manufacturing steps and to enhance the yield and reduce the manufacturing costs.

What is claimed is:

1. A method of manufacturing a solid-state image pickup device, the method comprising:
forming a transparent film on a surface of a substrate including a plurality of photoelectric conversion elements which are two-dimensionally arranged therein, said substrate having a plurality of rectangular light-receiving faces each corresponding to one of the photoelectric conversion elements;
forming a resist pattern having bobbin-shaped or deformed bobbin-shaped openings each being located in conformity with each of the rectangular light-receiving faces;
etching the transparent film using the resist pattern as a mask to form a flattening layer having a plurality of approximately rectangular concave faces each located to correspond to one of the light-receiving faces; and
forming a color filter including color layers of plural kinds of colors in the approximately rectangular concave faces and exhibiting a larger refractive index than that of the flattening layer, the color layers being respectively enabled to function as a convex lens;
wherein the opening of the resist pattern has a shape in which an acute-angled space is extended in four directions from a rectangular opening, the transparent film is dry etched in conformity with the shape of the opening of the resist pattern, and the etching proceeds not only in a vertical direction but also in a lateral direction, and is enabled to spread to a portion of the transparent film which is covered by the resist pattern, thus forming the flattening layer wherein a plurality of approximately rectangular concave faces are directly neighboring each other.

2. The method according to claim 1, wherein the flattening layer is formed of silicon dioxide or acrylic resin.

3. The method according to claim 1, wherein the color layers are formed of a material having a refractive index of 1.6-1.8.

4. The method according to claim 1, wherein the color layers of plural kinds of colors are formed directly neighboring each other at the surface of the concave faces.

* * * * *